United States Patent [19]
Williams

[11] 3,952,290
[45] Apr. 20, 1976

[54] READ-ONLY OPTICAL MEMORY SYSTEM

[75] Inventor: Donald N. Williams, San Diego, Calif.

[73] Assignee: The United States of America as represented by the Secretary of the Navy, Washington, D.C.

[22] Filed: Nov. 11, 1974

[21] Appl. No.: 522,808

[52] U.S. Cl. .................. 340/173 LM; 340/173 R
[51] Int. Cl.² .................. G11C 11/42; G11C 13/04
[58] Field of Search ............................ 340/173 LM

[56] References Cited
UNITED STATES PATENTS

| | | | |
|---|---|---|---|
| 3,072,889 | 1/1963 | Willcox | 340/173 LM |
| 3,191,157 | 6/1965 | Parker | 346/173 LM |
| 3,201,764 | 8/1965 | Parker | 340/173 LM |
| 3,305,669 | 2/1967 | Fan | 340/173 LM |
| 3,412,255 | 11/1968 | Kneger | 340/173 LM |
| 3,432,675 | 3/1969 | Roby | 340/173 LM |
| 3,750,114 | 7/1973 | Valassis | 340/173 LM |
| 3,855,582 | 12/1974 | Roberts | 340/173 LM |
| 3,858,186 | 12/1974 | Barker | 340/173 LM |

Primary Examiner—Terrell W. Fears
Attorney, Agent, or Firm—R. S. Sciascia; G. J. Rubens; J. W. McLaren

[57] ABSTRACT

An improved read-only optical memory system is provided comprising a mask having a plurality of discrete increments of recorded information defined by variations in opacity and a suitable light source positioned to illuminate the mask so that the mask transmits recorded information in the form of light energy in accordance with the opacity of the illuminated discrete increments. A multiple element photo responsive charge coupled device is positioned to receive the light energy transmitted by the illuminated mask and has its elements arrayed for developing a charge at each element position commensurate with the photo energy transmitted by an optically aligned discrete increment of the mask. Accordingly, the charges of the multiple elements are representative of the recorded information defined by variations in opacity of the mask and means for transferring the charges out of the charge coupled device is provided such as appropriate control logic and/or clocking pulses producing electrical signals from the individual discrete charges of each element in the charge coupled device which are representative of the recorded information. The mask is adapted to be replaceable providing access to as much additional recorded information as may be desired.

8 Claims, 3 Drawing Figures

READ-ONLY OPTICAL MEMORY SYSTEM

BACKGROUND OF THE INVENTION

There are numerous requirements for the storage and retention of data, program and other types of information.

In the prior art punched paper tape, magnetic tape and magnetic disks have been used to store and retain such data. More recently the advantages of electrooptic techniques have brought about the use of read-only memories employing photographic film to record the data. When used together with photodiode arrays the light energy transmitted through such a record on photographic film may be readily detected and converted to electrical signals. Such techniques, however, even though offering the advantages of electrooptic processing of data and other types of information, nonetheless suffer from the disadvantages of a great multiplicity of elements such as the photodiodes required, for instance. There are further problems resulting from the requirement for a great multiplicity of photodiodes such as excessive size relative to microfilming techniques available for recording on photographic film. Moreover, a high degree of complexity inhers in the many individual electrical connections required for the great multiplicity of such photodiodes required to provide the desired degree of optical resolution.

Accordingly, there is a need for an electrooptic read-only memory system which is extremely small in size, reliable in operation, adaptable to read-out different recorded information as desired, and embodying the advantages of the most advanced technological features as incorporated in solid state devices.

SUMMARY OF THE INVENTION

The concept of the present invention provides a read-only optical memory system inherently offering many desirable advantages as contrasted with prior art techniques and systems. The system of the present invention employs a mask having a plurality of discrete increments of recorded information defined by variations in opacity. Such increments may be aligned in a raster type of format and the recorded information may be in binary digital form so that a discrete increment which is opaque may be representative of a logic "false" or "zero," and a discrete increment which is transparent may be representative of a logic "true" or "one." Recorded information may be coded as desired or, alternatively, the recorded information can be linear in nature with varying degrees of transparency from complete opacity to full transparency representing analog values. Each discrete element of the recorded information would then have a degree of transparency representative of an analog quantity voltage or value to be used in the receiving equipment as a finite value.

A suitable light source is positioned to illuminate the described mask and a multiple element photo responsive charge coupled device is positioned to receive the light energy transmitted by the illuminated mask. The multiple element photo responsive charge coupled device has its elements arrayed for developing a charge at each element position commensurate with the photo energy transmitted by an optically aligned discrete increment of the described mask. Accordingly, the charges developed by each element of the charge coupled device is representative of the recorded information at that element position. Appropriate drive circuitry is employed to transfer the described charges out of the charge coupled device for such use in the end user equipment as may be desired.

The concept of the present invention is such that it avails of the extremely small sizes realizable through the use of microphotographic techniques to fabricate the mask employed in the novel system, together with the extremely small dimensions of multiple element photo responsive charge coupled devices which are consistent with the microminiature fabrication of semiconductor units.

For example, one typical multiple element photo responsive charge coupled device presently available in the current state of the art provides a format of one hundred by one hundred elements for a ten thousand element array integrated with appropriate drive circuitry in a "chip" integrated unit which measures only 0.12 by 0.16 inch. Thus, it can readily be appreciated that the concept of the present invention avails of and matches the extremely small and compact size of charge coupled devices to the comparably small size of recorded information such as may be realized by the use of microminiature techniques as applied to photographic film, for instance.

In certain embodiments of the present invention the mask containing the recorded information may be of a different size or have different aspect ratio than the photo responsive charge coupled device array, in which case element-to-element registration may be achieved by either optical magnification or reduction, as required, through the use of a fiber optic bundle in the form of a fiber optic lens. The use of such a fiber optic lens affords mechanical rigidity contributing to the durability of the system, in addition to being much smaller in size as contrasted to conventional optic lenses, and also eliminates edge distortion, and is best for adjusting the aspect ratios of mask and photo sensitive array.

Accordingly, it is the primary object of the present invention to provide a read-only memory system which incorporates the desirable features of electrooptic techniques as well as the advantages of advanced semiconductor technology.

A concomitant object of the present invention is to provide a read-only memory system which is extremely small and compact in size as well as affording the durability of solid state devices.

A further important object of the present invention is to provide such a read-only memory system which is readily adapted to receive and utilize different or replacement recorded data and information as may be desired.

A further object of the present invention is to provide a read-only memory system which is adapted to be useable with either digital or analog recorded data and information.

A further object of the present invention is to provide such a read-only memory system which is extremely small in size, light in weight, and has very low power requirements.

Other objects, advantages and novel features of the invention will become apparent from the following detailed description of the invention when considered in conjunction with the accompanying drawings.

DESCRIPTION OF THE PREFERRED EMBODIMENTS

Figure 1:
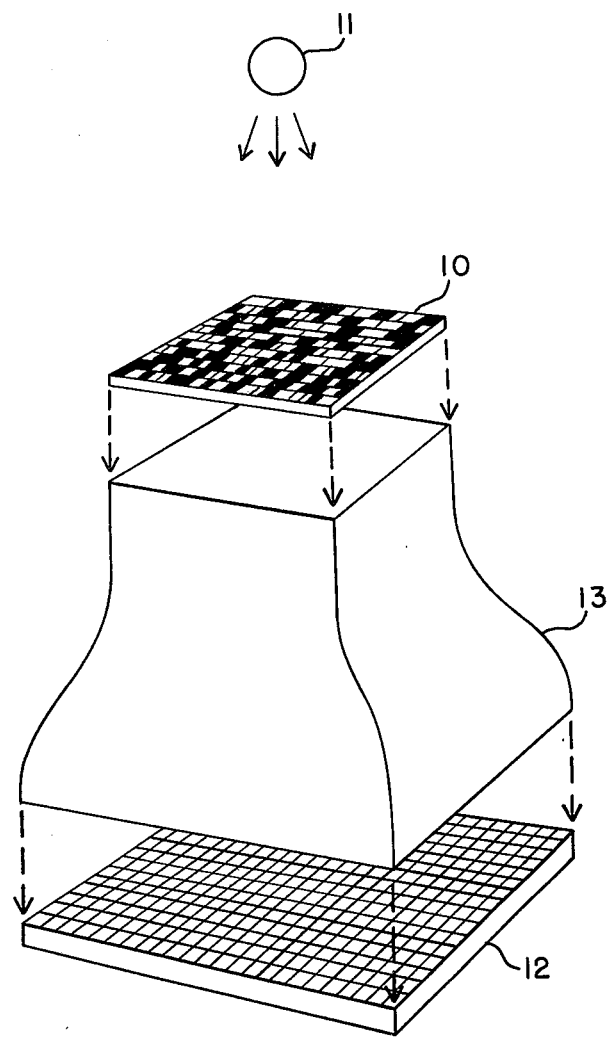
FIG. 1 is a perspective view of an embodiment of the present invention illustrating the spatial disposition of its primary elements.

FIG. 1 illustrates the principal elements employed in the practice of the present invention. A mask 10 is characterized as having a plurality of discrete increments of recorded information defined by variations in opacity which, as illustrated, appear as an irregular checkered pattern. Such a mask may appropriately comprise a photographic film exposed and developed to provide the desired recordation of information by variations in opacity, and such recorded information may be in binary form as exemplified by substantially non-transparent discrete increments which represent the digital data. Alternatively, gradations of transparency may be recorded to represent analog or linear data.

A suitable light source 11 is positioned to illuminate the mask 10 so that light energy is transmitted through those discrete elements of the mask 10 where permitted and is prevented from being transmitted at those discrete elements of the mask 10 where the mask is substantially opaque.

A multiple element photo responsive charge coupled device 12 is positioned to receive the light energy transmitted by the illuminated mask 10.

If a requirement exists to match the size of the mask 10 to the size of the multi-element photo responsive charge coupled device 12 by reason of a dimensional difference as is illustrated in the combination of FIG. 1, a suitable optical means may be employed for achieving spatial element-to-element registration. Such optical means may take the form of a fiber optic lens 13 as illustrated in FIG. 1. However, an optical matching means such as the fiber optic lens 13 is not an inherently necessary component of the novel combination envisioned by the concept of the present invention. In many instances the mask 10 containing the recorded information may be matched to the size of the photo responsive charge coupled device 12 so that the two elements may be used together in a simple overlay manner.

Where the photo responsive charge coupled device 12 is of a different size than the mask 10 containing the recorded information, a suitable optical means such as the fiber optic lens 13 has the advantage of being extremely durable and much more compact than conventional optical lenses. Moreover, a fiber optic lens eliminates the problem of edge distortion usually associated with conventional lens combinations.

The photo responsive charge coupled device 12 is of the multiple element type having its elements arrayed for developing a charge at each element position commensurate with the photo energy which is transmitted by an optically aligned discrete element of the mask 10. Accordingly, the charges developed by the multiple elements of the photo responsive charge coupled device 12 are respresentative of the recorded information defined by the variations in opacity of the discrete increments of the mask 10.

As is known to those skilled and knowledgeable in the pertinent arts, advanced charge coupled devices currently available not only include multiple elements which are photo responsive for developing charges commensurate with received light energy, but may also include within the same "chip" shift registers, detectors, preamplifiers, and output amplifiers. However, suitable drive circuitry is required to control the transfer of the described charges which are developed by the charge coupled device as a result of the reception of light energy at its multi-element surface.

Figure 2:
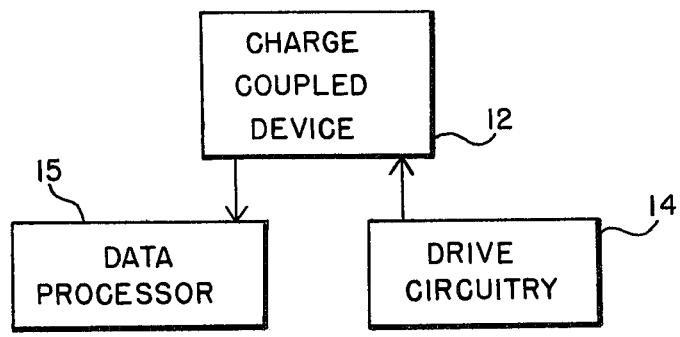
FIG. 2 is a schematic block diagram of an embodiment of the present invention; and, FIG. 3 is a schematic diagram illustrating the functional operation of a charge coupled device of the type which may be employed in the present invention.

FIG. 2 schematically illustrates a charge coupled device 12 arranged and connected to receive appropriate signals from drive circuitry 14 for the purpose of transferring the charges developed by the multiple elements of the charge coupled device 12 as outputs connected to associated end use equipment such as the data processor 15 of FIG. 2.

As will be readily appreciated by those skilled in the art the end use equipment receiving the output of the charge coupled device need not be a data processor but may be any associated receptor for which it is desired to develop electrical signals representative of the recorded information defined by variations in opacity on the mask 10 as illustrated in FIG. 1. Thus, the end use equipment 15 may comprise a data register, storage display, correlation means, etc.

An example of a charge coupled device suitable for use in the present invention is the Fairchild CCD201, two-phase, ten thousand element, self-scanning image sensor. This device employs charge coupled techniques with buried channels and ion implanted barriers. Its light responsive area is a one hundred by one hundred format array of photo responsive elements which provide an aspect ratio of $4 \times 3$. The image sensing elements are $1.2$ mils $\times 0.8$ mils located on $1.2$ mil vertical centers and $1.6$ mil horizontal centers and the overall dimensions of the unit are $0.12$ by $0.16$ inches.

In addition to the photo responsive image sensing elements, the unitized silicon chip also includes one hundred columns of two-phase analog shift registers interdigitated in the photo sensor array, a one hundred and two element two-phase analog output shift register, an output detector/preamplifier, and a compensation output amplifier. The unit is packaged in a 24 lead, dual in-line arrangement with an optical glass window.

Figure 3:
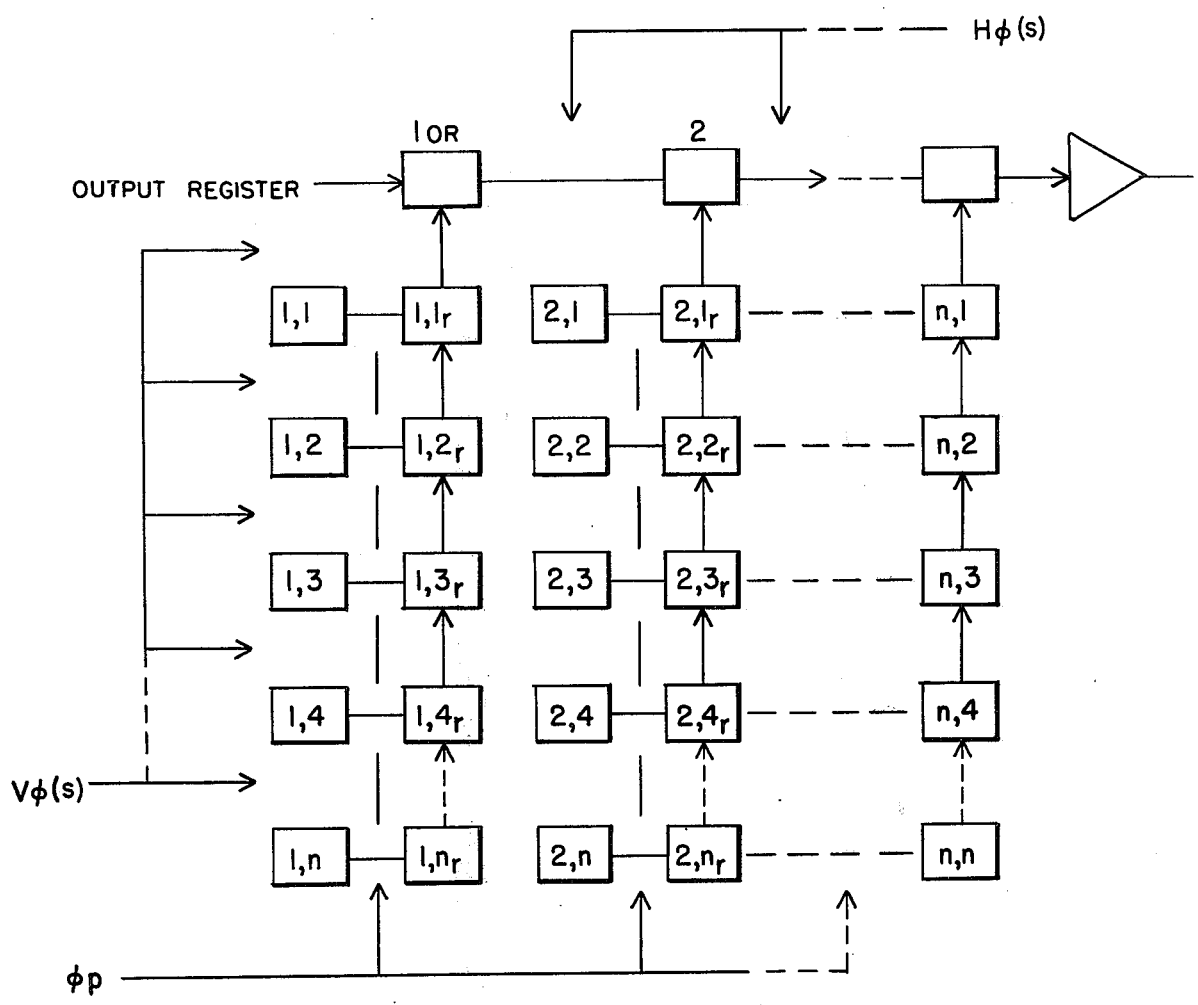

FIG. 3 schematically illustrates the operation of the photo responsive charge coupled device of the two-phase type. The schematic representation of FIG. 3 employs boxes labeled 1,1 1,2 1,3 1,4 etc. to 1,n to represent the photo responsive elements of the charge coupled array designating column 1, row 1, column 1, row 2, column 1, row 3, column 1, row 4 to column 1, row n. Similarly, the second column in its associated rows are designated by boxes labeled 2,1 2,2 2,3 2,4 2,n and succeeding columns to column n are schematically represented by the dash lines. Adjacent to each of the photo responsive elements 1,1 1,2 etc. is an associated charge coupled element which operates in the manner of a shift register and is labeled in FIG. 3 $1,1_r$ $1,2_r$ $1,3_r$ $1,4_r$ $1,n_r$.

Light energy which is incident on the image sensor elements of the charge coupled device schematically illustrated in FIG. 3 generates a packet of electrons in each such photo responsive element (1,1 to n,1 and n,1 to n,n). Suitable electrical clocking pulses applied to the photo gate designated $\phi p$ in FIG. 3 transfers each accumulated charge from the individual multiple photo responsive elements to its adjacent associated shift register gate element. That is to say, that the accumulated charge developed by the photo responsive element 1,1 of the first column in the first row is shifted to its adjacent associated shift register gate element 1,1$_r$ upon the reception of electrical clocking pulses $\phi$p. Similarly all the photo responsive elements 1,1 through n,n are acted upon by the electrical clocking pulse to shift their respective accumulated charges to their adjacent associated shift register gate elements, 1,1$_r$ through n,n$_r$. These individual multiple charges, having been shifted to their respective register elements, are representative of the accumulated light energy received by their associated photo responsive elements since the last $\phi$p transfer gate clocking pulse.

The vertical clock designated V $\phi$ (s) in FIG. 3 then operates to shift the entire shift register data up one element. That is to say, that the charge in the 1,1$_r$ shift register gate is transferred to the first element in the output register the 2,1$_r$ shift register charge is transferred to the second output register element and simultaneously the top row 1,1$_r$ through n,1$_r$ is shifted up one element into the respective output register element for each such column.

A horizontal clock designated H$\phi$(s) then operates to shift the output register bits sequentially to the right as depicted in FIG. 3 and an output buffer amplifier provides a low impedance drive for peripheral user devices.

When the full sequences of such operation have been completed and after all the information has been shifted out of the output register, the vertical clock V$\phi$(s) shifts the entire array of registered data up one row again. Accordingly, what was the 1,2 to n,2 (second row) is received in the output registers. The horizontal clocking sequence again shifts the data to the right and out through the output amplifier. This sequence is repeated until the bottom line 1,n through n,n is transferred as the output through the amplifier.

During the sequence of these operations charges are built up in the photo responsive elements of the charge coupled device and the entire sequence may be repeated to provide redundant data as required in particular applications of the present invention. Output data derived from the sequence of operations of the charge coupled device as described may be stored in a buffer memory or be employed in the user equipment for processing or as otherwise desired.

In the digital mode the output data is in the form of logical "1" and "0" format and may be used directly by digital logic.

In the analog form each bit has a discrete value represented by its amplitude of voltage. Accordingly, the user equipment may use such an analog output signal directly or it may be further processed. One such procedure for further processing may be the desire to digitize the value of each element into a digital word for user equipment as may be required. Such operation would employ analog to digital conversion means between the output of the charge coupled device and the end user equipment. In the schematic block diagram of FIG. 2 drive circuitry 14 is shown as connected to the charge coupled device 12. Included within the drive circuitry 14 is the digital logic required to provide properly phased transfer clock signals such as $\phi$p, the horizontal and vertical clocks H$\phi$1 and 2, and V$\phi$1 and 2, as well as the necessary start, ready, inhibit, and stop logic as required for implementation with the user equipment.

Other signals and controls than those shown and described may be required depending upon the exact type of charge coupled array employed. For example, some charge coupled devices are "two-phase" type while others may be operative as "three-phase" types. Suitable drive circuitry employing established conventional techniques and elements are available from manufacturers of charge coupled devices such as the Fairchild CCD201, for example, including schematic wiring diagrams complete with values for the electrical components employed.

It will be easily appreciated by those skilled and knowledgeable in the art that the concept of the present invention provides the solid state, extremely compact, high speed, electrooptical read-only memory system having a broad spectrum of potential usages. Some such uses include photographic inserts in micro format which provides the permanent storage of recorded information but yet avails of the substitution of any desired number of such permanently stored recorded information as desired.

Moreover, by the addition of an analog-to-digital converter at the output of the invention of the present system, it may be used as a picture digitizer. That is to say, that a photographic negative or positive transparency film transparency may be used as the film insert input. The output analog elements then may be digitized with the resultant multi-element digital data representing the digitized scene either in multiple gray levels, or by the use of a level or threshold discriminator converted into a simple black or white bit for each scene element.

Additionally, the present invention may be used in a process where a photographic input may be analyzed for its correlation with other known images in a digital processing method. By such use determinations may be programmed into the user equipment to identify objects which have changed location, been removed, or added to the scene between the two compared images.

Obviously many modifications and variations of the present invention are possible in the light of the above teachings. It is therefore to be understood that within the scope of the appended claims the invention may be practiced otherwise than as specifically described.

What is claimed is:
1. A read-only optical memory system comprising:
  a mask having a plurality of discrete increments of recorded information defined by variations in opacity;
  a light source positioned to uniformly illuminate all said discrete increments of said mask;
  a multiple element, photo-responsive charge coupled device positioned to receive the light energy transmitted through the illuminated mask and having its elements arrayed for developing a charge at each element position commensurate with the photo energy transmitted through an optically aligned discrete increment of said mask, whereby the charges of said elements are representatives of said recorded information; and
  means for transferring said charges out of said charge coupled device.

2. A read-only optical memory system as claimed in claim 1 wherein the recorded information of said mask is solely defined by substantially transparent and substantially non-transparent discrete increments representative of digital data.

3. A read-only optical memory system as claimed in claim 1 wherein the recorded information of said mask is defined by continuously varying degrees of transparency representative of commensurate analog data.

4. A read-only optical memory system as claimed in claim 1 and including a fiber optic lens for transmitting photo energy from said mask to said charge coupled device.

5. A read-only optical memory system as claimed in claim 1 wherein said means for transferring charges out of said charge coupled device is operative to produce line-by-line output signals representative of said recorded information.

6. A read-only optical memory system as claimed in claim 1 wherein said means for transferring charges out of said charge coupled device is operative to provide random access to selectively transfer the charge from any desired element position within the multiple element array.

7. A read-only optical memory system as claimed in claim 1 wherein said mask is replaceable by different masks providing access to additional recorded information.

8. A read-only optical memory system as claimed in claim 1 wherein said mask is a photographic film.

* * * * *